US 6,750,485 B2

(12) United States Patent
Berezin et al.

(10) Patent No.: US 6,750,485 B2
(45) Date of Patent: Jun. 15, 2004

(54) LOCK IN PINNED PHOTODIODE PHOTODETECTOR

(75) Inventors: Vladimir Berezin, La Crescenta, CA (US); Alexander Krymski, La Crescenta, CA (US); Eric R. Fossum, La Canada, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/459,595

(22) Filed: Jun. 12, 2003

(65) Prior Publication Data
US 2003/0213984 A1 Nov. 20, 2003

Related U.S. Application Data

(62) Division of application No. 09/867,846, filed on May 29, 2001, which is a continuation of application No. 09/378,565, filed on Aug. 19, 1999, now Pat. No. 6,239,456.
(60) Provisional application No. 60/097,135, filed on Aug. 19, 1998.

(51) Int. Cl.[7] .............................................. H01L 31/062
(52) U.S. Cl. ........................ 257/232; 257/233; 257/217; 257/232
(58) Field of Search ................................ 257/232, 233, 257/247, 292

(56) References Cited

U.S. PATENT DOCUMENTS

| 5,691,486 | A | * | 11/1997 | Behringer et al. | ........ 73/863.73 |
| 5,936,986 | A | * | 8/1999 | Cantatore et al. | ........ 372/38.02 |
| 6,388,243 | B1 | * | 5/2002 | Berezin et al. | .......... 250/208.1 |
| 5,497,390 | A1 | | 3/2003 | Tanaka et al. | |
| 6,614,479 | B1 | * | 9/2003 | Fukusho et al. | ............ 348/340 |
| 2002/0180875 | A1 | * | 12/2002 | Guidash | ..................... 348/280 |

* cited by examiner

Primary Examiner—David Nelms
Assistant Examiner—Dao H. Nguyen
(74) Attorney, Agent, or Firm—Dickstein Shapiro Morin & Oshinsky LLP

(57) ABSTRACT

A lock in pinned photodiode photodetector includes a plurality of output ports which are sequentially enabled. Each time when the output port is enabled is considered to be a different bin of time. A specified pattern is sent, and the output bins are investigated to look for that pattern. The time when the pattern is received indicates the time of flight.

4 Claims, 4 Drawing Sheets

LOCK IN PINNED PHOTODIODE PHOTODETECTOR

CROSS REFERENCE TO RELATED APPLICATIONS

This application is a divisional of U.S. patent application Ser. No. 09/867,846, filed May 29, 2001, which is a continuation of U.S. patent application Ser. No. 09/378,565, filed Aug. 19, 1999, now U.S. Pat. No. 6,239,456, which claims the benefit of the U.S. Provisional Application No. 60/097,135, filed on Aug. 19, 1998, all of which are incorporated herein by reference.

BACKGROUND

Certain applications require measuring aspects that are based on the speed of light.

For example, range finding can be carried out using optics. An optical signal is sent. The reflection therefrom is received. The time that it takes to receive the reflection of the optical signal gives an indication of the distance.

The so called lock-in technique uses an encoded temporal pattern as a signal reference. The device locks into the received signal to find the time of receipt. However, noise can mask the temporal pattern.

A lock in photodetector based on charged coupled devices or CCDs has been described in Miagawa and Kanada "CCD based range finding sensor" IEEE Transactions on Electronic Devices, volume 44 pages 1648–1652 1997.

CCDs are well known to have relatively large power consumption.

SUMMARY

The present application describes a special kind of lock in detector formed using CMOS technology. More specifically, a lock in detector is formed from a pinned photodiode. The photodiode is modified to enable faster operation.

It is advantageous to obtain as much readout as possible to maximize the signal to noise ratio. The pinned photodiode provides virtually complete charge transfer readout.

Fast separation of the photo-generated carriers is obtained by separating the diode into smaller sub-parts and summing the output values of the subparts to obtain an increased composite signal.

BRIEF DESCRIPTION OF THE DRAWINGS

These an other aspects will now be described in detail with reference to the accompanying drawings, wherein.

DESCRIPTION OF THE PREFERRED EMBODIMENT

The present application uses a special, multiple output port pinned photodiode as the lock in pixel element. The photodiode is preferably part of a CMOS active pixel image sensor, of the type described in U.S. Pat. No. 5,471,515. Hence, the system preferably includes in-pixel buffer transistors and selection transistors, in addition to the CMOS photodetector.

Figure 1:
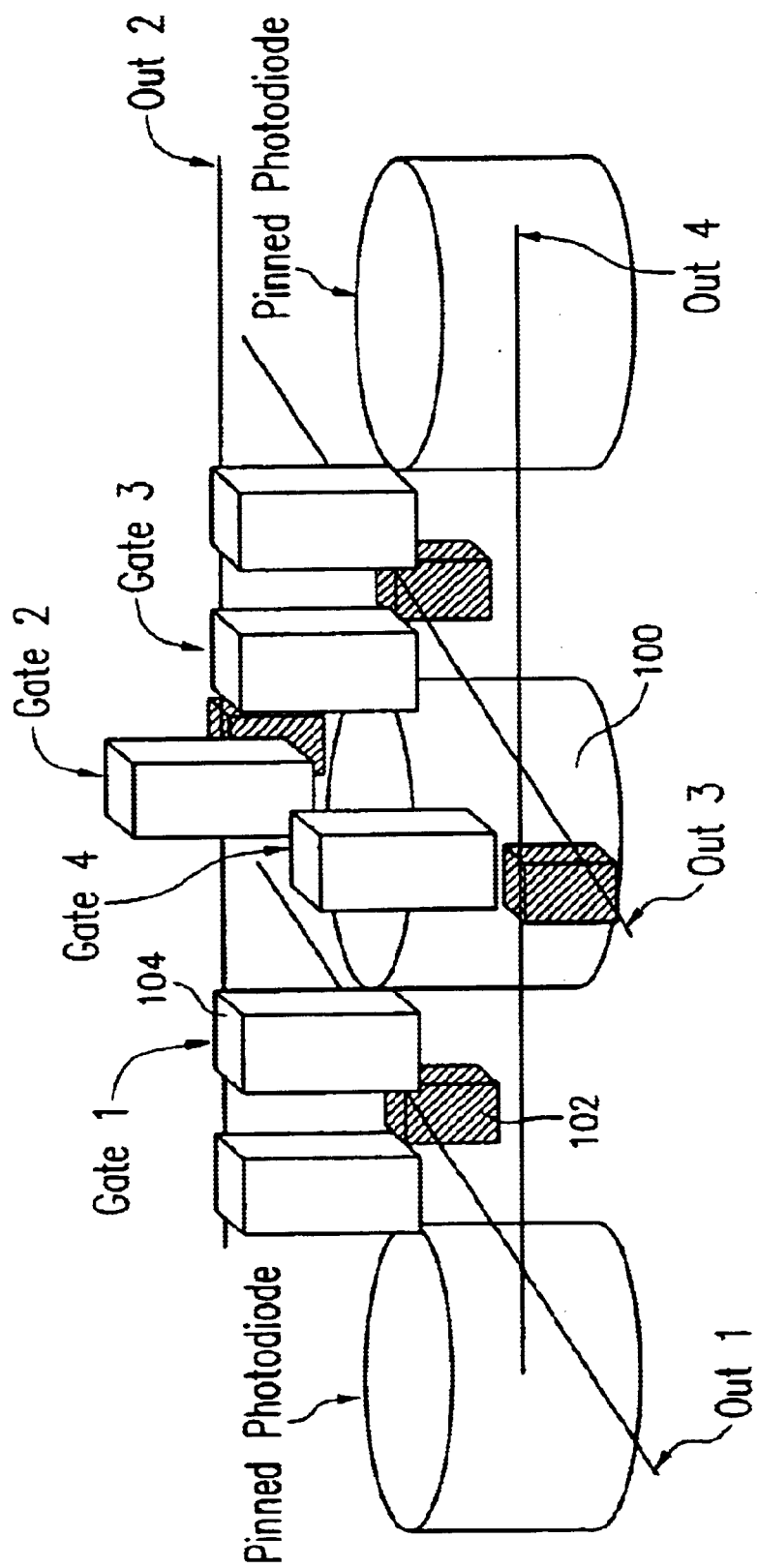
FIG. 1 shows a basic block diagram of the system.

FIG. 1 shows a pinned photodiode with four output ports, labeled as out1–out4. Each of the output ports is used to receive a reflection for a specified time duration. Each output becomes a "bin". The counting of the amount of information in the bins enables determination of the reflection time, and hence the range.

Pinned photodiodes are well known in the art and described in U.S. Pat. No. 5,904,493. A pinned photodiode is also known as a hole accumulation diode or HAD, or a virtual phase diode or VP diode. Advantages of these devices are well known in the art. They have small dark current due to suppression of surface generation. They have good quantum efficiency since there are few or no polysilicon gates over the photosensitive region. Pinned photodiodes can also be made into smaller pixels because they have fewer gates.

The basic structure of the pinned photodiode lock in pixel is shown in FIG. 1. Four switched integrators are formed respectively at four output ports. Each gate is enabled during a specified period. The different integrators integrate carriers accumulated during the different periods. The first integrator accumulates carriers between 0 and $\pi/2$, the second between $\pi/2$ and n, the third between $\pi$ and $3\pi/2$ and the fourth between $3\pi/2$ and $2\pi$ time slots.

Assuming the light to be a cosine phase, then the phase shift of the detected light is given by $$\arctan[(L1-L3)/(L2-L4)],$$

where L1, L2, L3 and L4 are the amplititudes of the samples from the respective first, second, third and fourth integrators. These four phases are obtained from the four outputs of the photodiode.

The first pinned photodiode 100 is connected to an output drain 102 via gate 1, element 104. This receives the charge for the first bin. Similarly, gates 2, 3 and 4 are turned on to integrate/bin from the second, third and fourth periods.

It is important to obtain as much signal as possible from the photodiode. This can be done by using a large photodiode. However, it can take the electrons a relatively long time to escape from a large photodetector.

Figure 2:
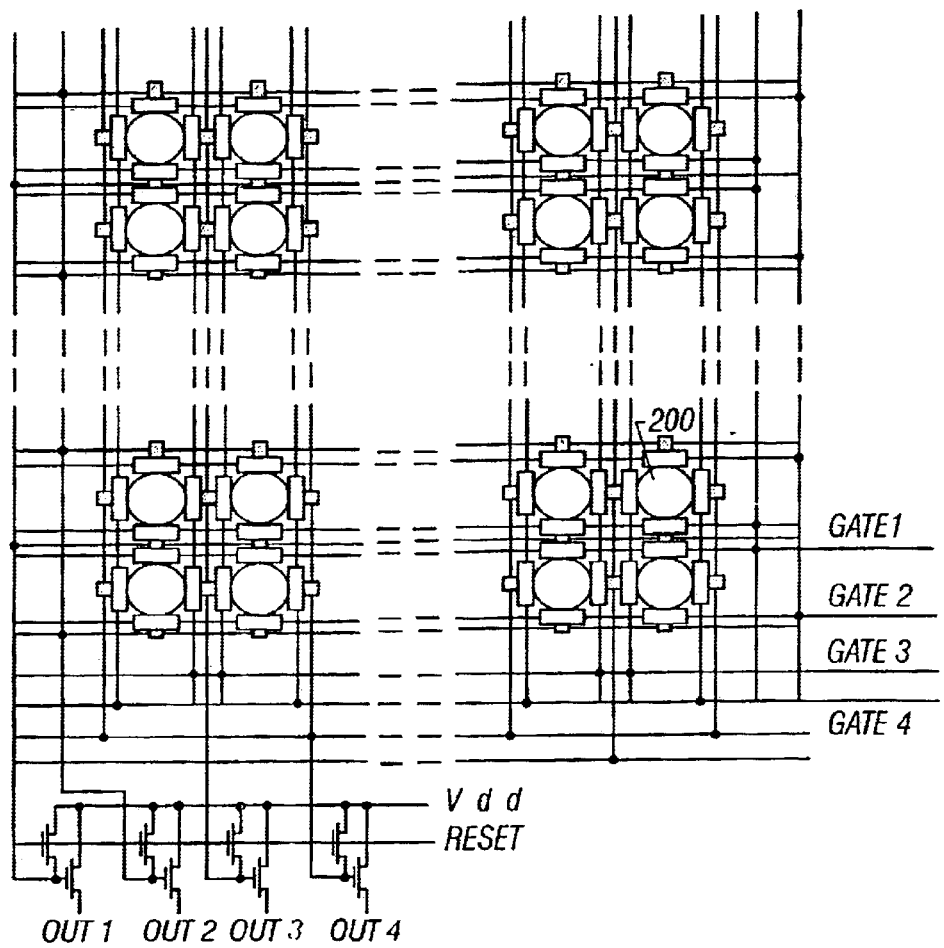
FIG. 2 shows a block diagram of the multiple photodiode parts.

The present system divides the one larger photodiode into a number of smaller diodes, each with multiple output ports. FIG. 2 shows the system.

A number of subpixels are formed. Each includes a number of pinned photodiodes 200, each with four ports. Each of the corresponding ports are connected together in a way that allows summing the outputs of the photodiodes. For example, all the gate 1 control lines are connected together as shown. The outputs from all the port is are also summed, and output as a simple composite output. Similarly, ports 2, 3 and 4's are all summed.

Figure 3:
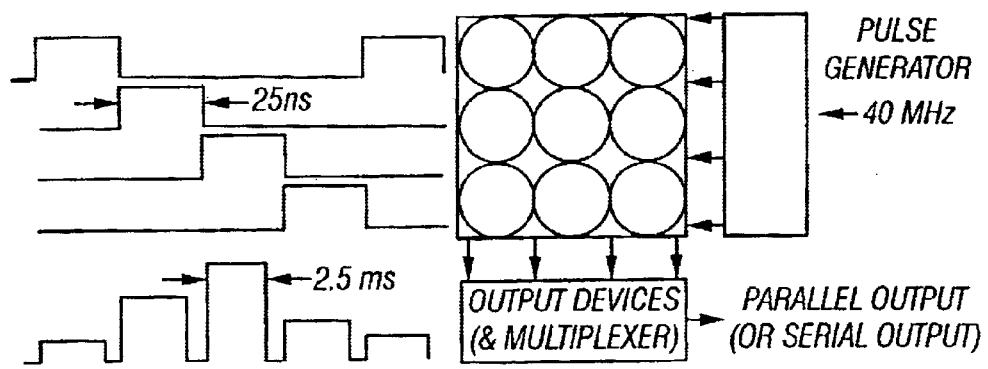
FIG. 3 shows a block diagram of the system as used in range finding.

FIG. 3 shows the circuit and driving waveforms for the system when used as a range finder. A pulse generator drives selection of the active output. Each time period is separately accumulated, and output. If a 40 MHZ pulse generator is used, 25 ns resolution can be obtained.

Figure 4A:
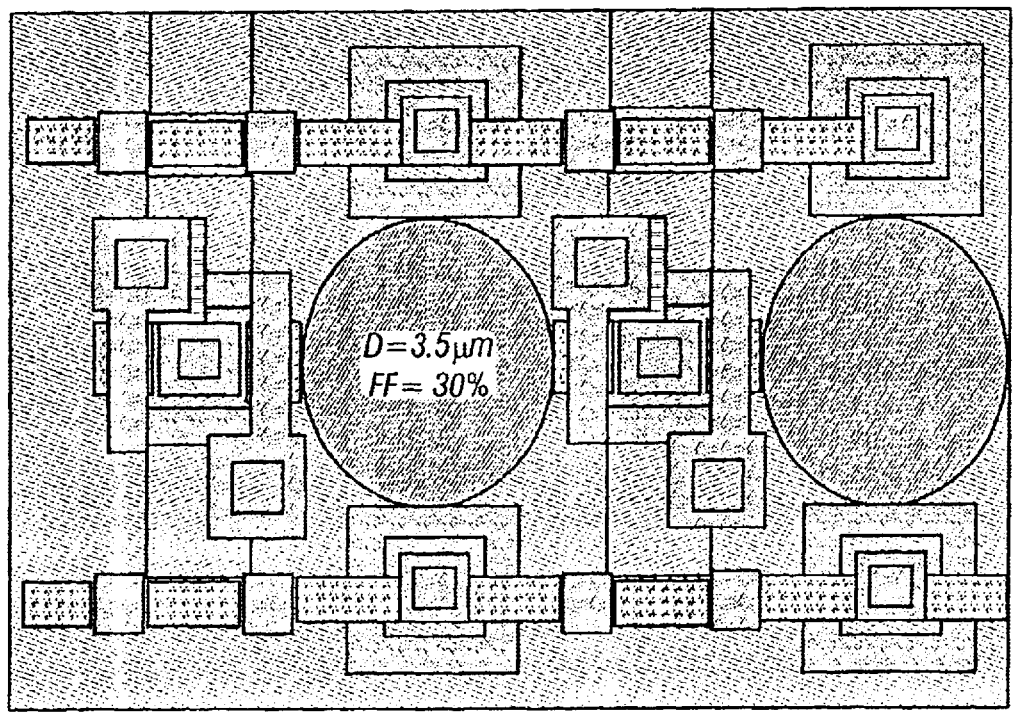
FIGS. 4*a* and 4*b* show pixel layouts.
Figure 4B:
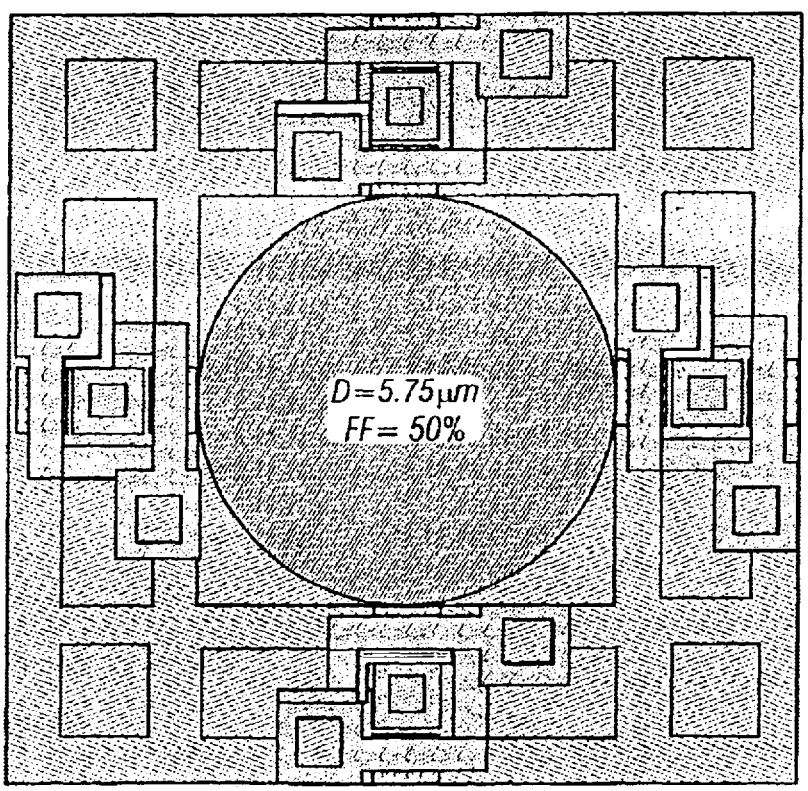

FIGS. 4A and 4B show representative pixel layouts. FIG. 4A shows a 6 by 6 square micron pixel layout while FIG. 4B shows an 8½ by 8½ micron pixel layout. In both Figures, four outputs are shown.

Figure 5:
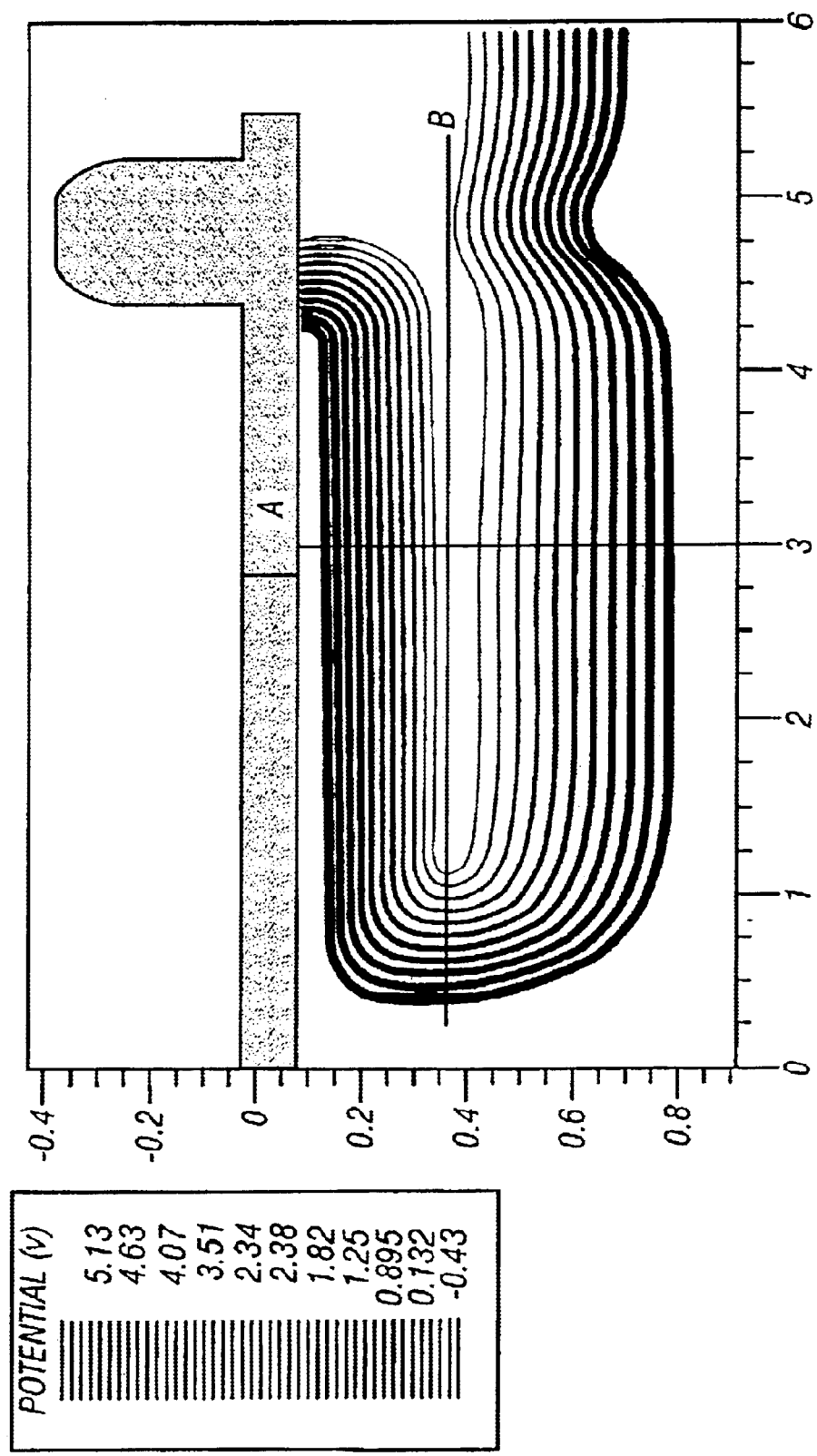
FIG. 5 shows a cross section of the pinned photodiode.

FIG. 5 shows a cross sectional potential diagram of an exemplary pinned photodiode.

Assuming the operation frequency of modulated light is 10 megahertz with a 25 nanosecond integration slot, the generator carrier has a time of flight within this limit. This resolution time constrains the size of the detector. In addition, the characteristic diffusion time in a semiconductor device is $L^2/D$, where D is the diffusion coefficient. This time originates from the continuity equation and the diffusion equation, and defines how soon the steady state will be established in the area of size L. Hence, for a 10 cm square per second electron diffusion coefficient, the characteristic size of the pinned photodiode could be less than 5 microns.

Other embodiments are also contemplated to exist within this disclosure. For example, other numbers of output ports, e.g. 2–8, are possible. While this application describes using a pinned photodiode, similar operations could be carried out with other CMOS photodetectors, e.g., photodiodes and photogates.

Such modifications are intended to be encompassed within the following claims.

What is claimed is:

1. A system, comprising:

a pinned photodiode having a photodiode area;

a plurality of gates, each of said plurality of gates having one end coupled to said photodiode area; and a plurality of photocarrier integrator elements, each of said photocarrier integrator elements coupled to the other end of each of said plurality of gates.

2. The system as in claim 1, further comprising a control input on each of said plurality of gates, enabling connection of a respective photocarrier integrator element to said photodiode area.

3. The system as in claim 2, further comprising a controller element which drives said control input controlling said plurality of gates such that no more than one of said control element is active at any time.

4. The system as in claim 3, wherein there are four of said photocarrier integrator elements, and wherein said controller element successively enables a first photocarrier integrator to accumulate carrier between a time 0 to $\pi/2$, a second photocarrier integrator to accumulate carriers between a time $\pi/2$ and $\pi$; a third photocarrier integrator to accumulate carriers between a time $\pi$ and $3\pi/2$, and a fourth photocarrier integrator to accumulate carriers between a time $3\pi/2$ and $2\pi$.

* * * * *

UNITED STATES PATENT AND TRADEMARK OFFICE
CERTIFICATE OF CORRECTION

PATENT NO. : 6,750,485 B2
DATED : June 15, 2004
INVENTOR(S) : Vladimir Berezin et al.

It is certified that error appears in the above-identified patent and that said Letters Patent is hereby corrected as shown below:

<u>Column 2,</u>
Line 20, "n," should read -- π, --;
Line 45, "is" should read -- 1s --.

Signed and Sealed this

Seventh Day of December, 2004

JON W. DUDAS
*Director of the United States Patent and Trademark Office*